(12) United States Patent
Oberholzer

(10) Patent No.: US 10,707,780 B2
(45) Date of Patent: Jul. 7, 2020

(54) CONVERTER AND METHOD FOR OPERATING A CONVERTER

(71) Applicant: Celeroton AG, Volketswil (CH)

(72) Inventor: Georg Oberholzer, Volketswil (CH)

(73) Assignee: CELEROTON AG, Volketswil (CH)

( * ) Notice: Subject to any disclaimer, the term of this patent is extended or adjusted under 35 U.S.C. 154(b) by 0 days.

(21) Appl. No.: 16/334,934

(22) PCT Filed: Sep. 20, 2017

(86) PCT No.: PCT/EP2017/073719
§ 371 (c)(1),
(2) Date: Mar. 20, 2019

(87) PCT Pub. No.: WO2018/054942
PCT Pub. Date: Mar. 29, 2018

(65) Prior Publication Data
US 2020/0021206 A1    Jan. 16, 2020

(30) Foreign Application Priority Data

Sep. 22, 2016    (EP) .................................... 16190058

(51) Int. Cl.
*H02M 1/08* (2006.01)
*H02M 7/5387* (2007.01)
(Continued)

(52) U.S. Cl.
CPC .... *H02M 7/53871* (2013.01); *G01R 19/2509* (2013.01); *G01R 31/42* (2013.01);
(Continued)

(58) Field of Classification Search
CPC ............... H02M 7/53871; H02M 1/08; H02M 2001/0009; G01R 19/2509; G01R 31/42; H02P 27/06
See application file for complete search history.

(56) References Cited

U.S. PATENT DOCUMENTS 4,447,868 A * 5/1984 Turnbull ............... H02M 7/219
                                                          363/126
4,504,895 A * 3/1985 Steigerwald ........ H02M 3/3376
                                                          363/132
(Continued)

FOREIGN PATENT DOCUMENTS

EP    1 432 107    6/2004
GB    2512078      9/2014
JP    2001-16865   1/2001

OTHER PUBLICATIONS

International Preliminary Report on Patentability dated Mar. 26, 2019 (dated Mar. 26, 2019), Application No. PCT/EP2017/073719, 8 pages.

(Continued)

*Primary Examiner* — Adolf D Berhane
(74) *Attorney, Agent, or Firm* — Rankin, Hill & Clark LLP

(57) ABSTRACT

A converter having a negative DC terminal and a positive DC terminal; at least three AC terminals, each AC terminal being arranged for an associated AC current to flow through the terminal, a converter bridge with at least three bridge legs, each bridge leg being associated with one of the at least three AC terminals and being able to connect the associated AC terminal to the negative DC terminal or the positive DC terminal; and a current measurement circuit having a current measurement element, the current measurement circuit being configured to guide either none or one or more of the AC currents flowing through one of the at least three AC terminals through the current measurement element.

20 Claims, 5 Drawing Sheets

(51) Int. Cl.
 *G01R 19/25* (2006.01)
 *G01R 31/42* (2006.01)
 *H02M 1/00* (2006.01)
 *H02P 27/06* (2006.01)

(52) U.S. Cl.
 CPC ...... *H02M 1/08* (2013.01); *H02M 2001/0009* (2013.01); *H02P 27/06* (2013.01)

(56) References Cited

U.S. PATENT DOCUMENTS

| | | | | |
|---|---|---|---|---|
| 5,163,172 | A * | 11/1992 | Hakala | H02M 7/53875 318/762 |
| 7,119,530 | B2 | 10/2006 | Mir et al. | |
| 2003/0184326 | A1 | 10/2003 | Throngnumchai | |
| 2005/0073271 | A1 | 4/2005 | Miyagoe | |
| 2012/0163046 | A1 * | 6/2012 | Hibino | H02P 27/08 363/37 |
| 2013/0293171 | A1 * | 11/2013 | McLean | H02P 6/10 318/400.32 |
| 2014/0285179 | A1 * | 9/2014 | Hart | H02M 7/5387 324/86 |
| 2015/0326145 | A1 * | 11/2015 | Karlsson | H02M 7/5387 363/98 |
| 2019/0273455 | A1 * | 9/2019 | Lau | H02M 7/53873 |
| 2019/0319550 | A1 * | 10/2019 | Watanabe | H02M 1/08 |
| 2019/0326845 | A1 * | 10/2019 | Pokkinen | H02P 27/06 |

OTHER PUBLICATIONS

Ting-Yu Chang, et al., "A Low Voltage High Current EV Drive Using Inverter Low Side Switches as Current Sensors", Power Electronic and Drive Systems, 2009, PEDS 2009, Nov. 2, 2009, pp. 1429-1434, Piscataway, NJ, USA; cited in the International Search Report, discussed in the specification.

* cited by examiner

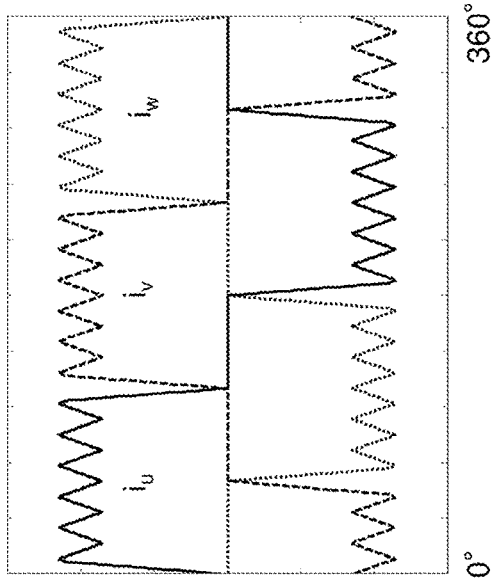
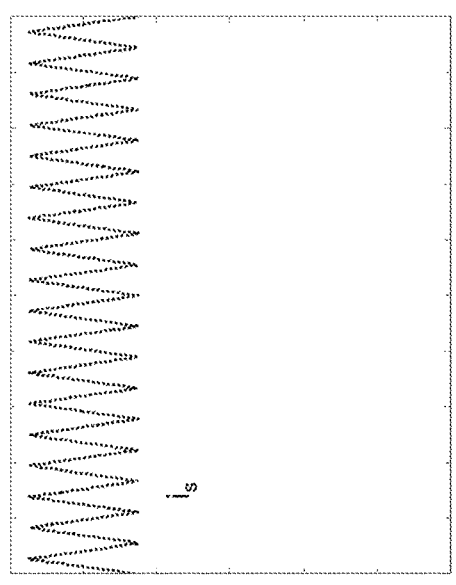
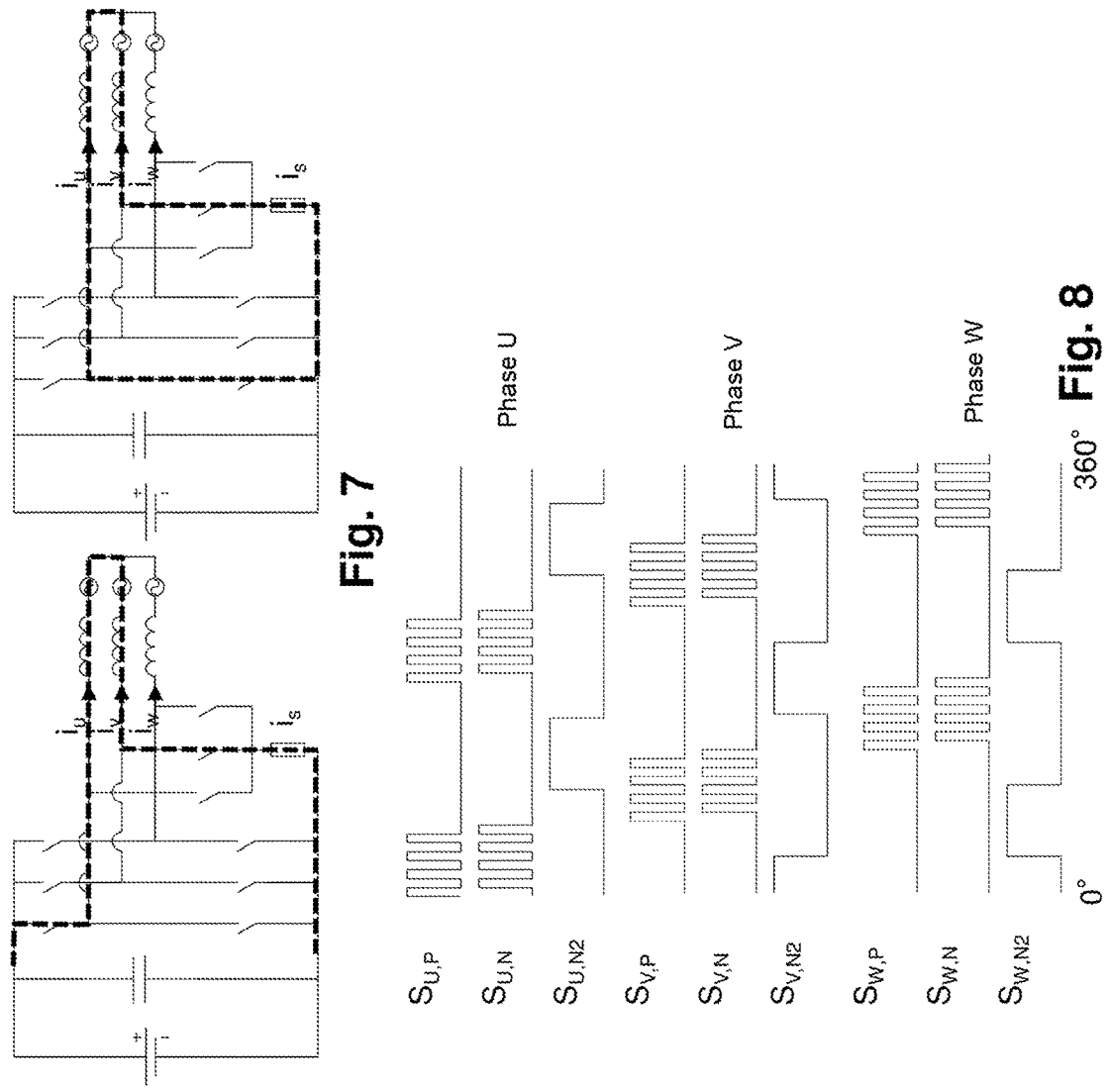
Fig. 7
Fig. 8
Fig. 9
Fig. 10

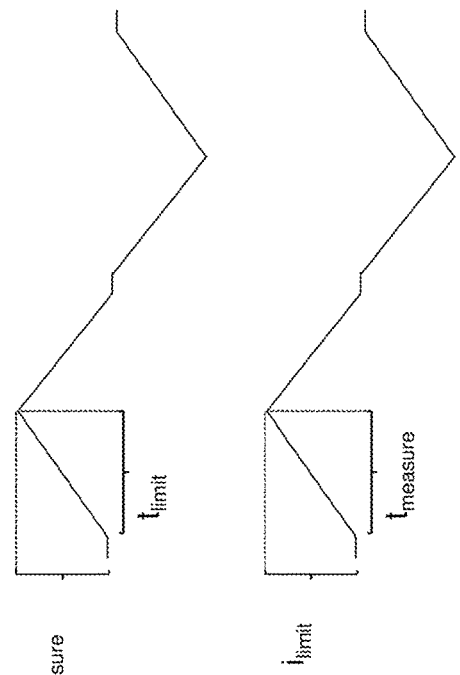
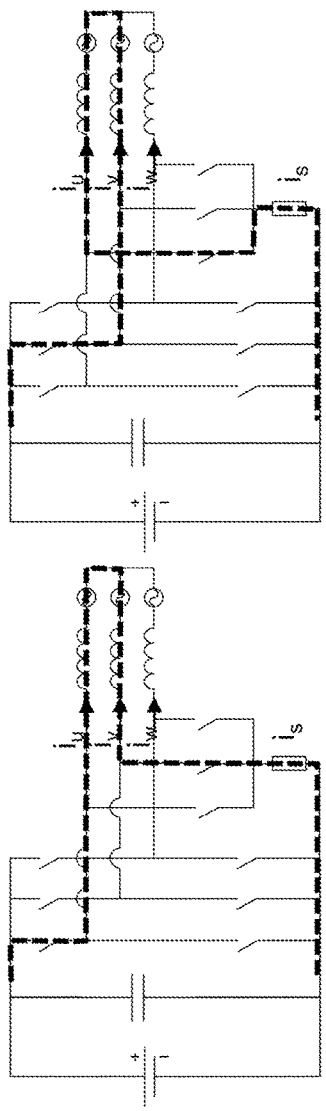
Fig. 15
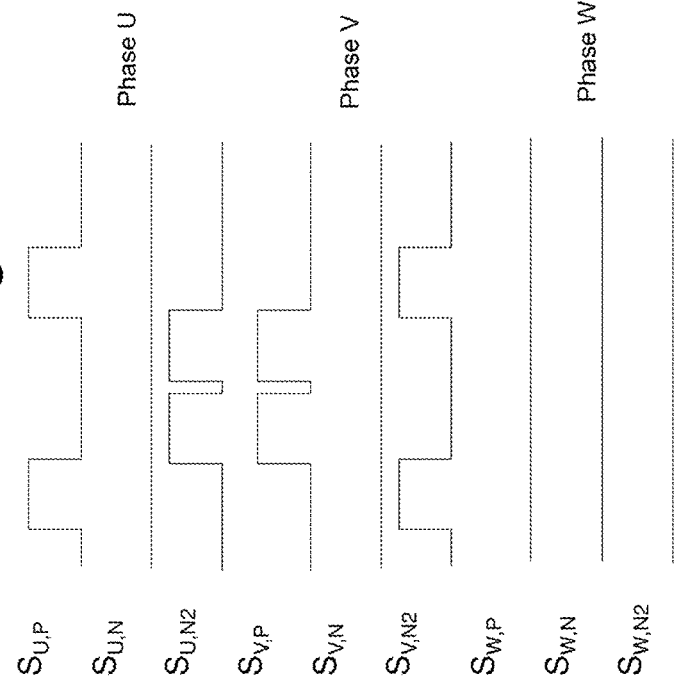
Fig. 16
Fig. 17

CONVERTER AND METHOD FOR OPERATING A CONVERTER

BACKGROUND OF THE INVENTION

Field of the Invention

The invention generally relates to the field of electrical drives and, more specifically, to a converter and a method for operating a converter.

Description of Related Art

When operating an electrical power converter, in particular a DC-AC converter, in particular a three-phase DC-AC converter, it often is desirable to measure one or more currents on the AC side, for example, in order to control the torque of a motor connected to the converter or the power exchanged on the AC side, or the power factor.

Various measurement topologies and associated methods have been proposed. For example, U.S. Pat. No. 7,119,530 B2 shows a shunt arranged in the DC link of a converter. The AC phase currents flow through the shunt and depending on the switching state of the converter one single phase current or the sum of two phase currents can be measured with the shunt, except during freewheeling intervals when two or three upper or lower power switches are conducting to circulate the current through two or three phases, but no current is flowing in the DC link and therefore no current is flowing in the shunt.

Ting-Yu Chang; Ching-Tsai Pan; Fang, E., "*A low voltage high current EV drive using inverter low side switches as current sensors,*" in International Conference on Power Electronics and Drive Systems, 2009. PEDS 2009. vol., no., pp. 1429-1434, 2-5 Nov. 2009, shows a converter bridge in which, in the lower branch of each bridge leg, each of the power switches has an associated auxiliary switch that is also connected to the midpoint of the bridge leg and leads, via a multiplexer, to a measurement circuit. The auxiliary switch is controlled by the same gate control line as the power switch and is therefore switched on and off in synchrony with the power switch. As a result, when a power switch is closed, so is the auxiliary switch, and the multiplexer can measure the voltage over the power switch and from this the current through the power switch and the AC phase connected to the bridge leg can be determined. The power switch thus acts as a current measurement shunt.

US 2005/073271 A1 shows, for each leg of a converter, a current mirror circuit that can be activated to guide a predetermined small fraction of the current that passes through the leg through a shunt. As usual, the voltage over the shunt is measured in order to determine the shunt current. Scaling up the shunt current determines a corresponding branch current and phase current.

EP 1432107 A2 shows auxiliary switches arranged as in Chang et al. cited above, but with separate measurement circuits for each leg instead of the multiplexer and common measurement circuit, and with a separate current sensor per phase leg instead of measuring the voltage over the power switch and from this the current through the power switch and the AC phase connected to the bridge leg. US 2003/184326 A1 shows an analogous arrangement for a single-phase converter.

Disadvantages of prior art arrangements are:

If several shunts and associated amplifiers or other current sensors are used, space requirements and costs go up. This is particularly the case for small voltages or power and/or for high currents, as then the current measurement space and cost share on the entire converter space and cost are significant, which in this context means, e.g., more than 1% or more than 5%.

If a single shunt is arranged in the DC link, then the current flowing through the shunt is discontinuous, because in freewheeling intervals, no current flows through the DC link and through the shunt. The current discontinuities appear with the switching frequency, and corresponding high frequency measurement amplifiers and filters are required for measurement. High frequency disturbances are difficult to separate from the high frequency current signals. This is particularly relevant for converters with small voltages (lower than 100V) and power (below 500 W or below 200 W) as these converters are switched with high switching frequency.

When implementing a peak current controller for the AC currents, such a single DC link shunt current measurement provides only an upper peak value of the current, the lower peak is not detectable because the current is discontinuous and therefore the current measurement is blind for the decreasing current interval within every switching period. Therefore, a more complex peak current control with a timer for switching from decreasing to increasing current interval is required.

Current mirrors require non-standard semiconductors, analogue circuit adjustments and do not allow a direct phase current measurement.

Current measurement via a voltage measurement on the power semiconductors depends on the gate voltage of the power semiconductor and therefore is inaccurate, and requires separate amplifiers or a multiplexer.

If a single shunt is arranged in the DC link and if sinusoidal current modulation is applied, the shunt current varies between single phase currents, the sum of two phase currents, or zero depending on the switching state of the converter.

If a single shunt is arranged in the DC link and if current or voltage pulses are applied to the motor and the voltage or current feedback is measured for sensorless position detection, the filter applied to the shunt signal is a trade-off between high bandwidth filtering for drive control and high accuracy filtering for sensorless position detection.

SUMMARY OF THE INVENTION

It is therefore an object of the invention to create a converter and a method for operating a converter of the type mentioned initially, which overcome at least one of the disadvantages mentioned above.

This object is achieved at least in part by a converter (or electrical power converter) and a method for operating a converter.

The converter includes a negative DC terminal and a positive DC terminal;

at least three AC terminals each AC terminal being arranged for an associated AC current to flow through the terminal;

a converter bridge with at least three bridge legs, each bridge leg being associated with one of the at least three AC terminals and being able to connect the associated AC terminal to the negative DC terminal or the positive DC terminal;

a current measurement circuit including a current measurement element, the current measurement circuit being configured to guide none, one, or more (in particular two) of the AC currents flowing through at least one of the at least three AC terminals through the current measurement element.

If one of the AC currents flows through the current measurement element, this means that the entire AC current flowing across the terminal, and not only part of it, flows through the current measurement element.

This makes it possible to select, during operation of the converter, any one of the AC terminals and to guide its associated AC current not through the converter bridge but through the current measurement circuit and through the current measurement element instead. As a result, only a single current measurement element is required.

Furthermore, even in freewheeling phases an AC current can be guided through the current measurement element. Thus the current (measurement current is) through the current measurement element can be made to be quasi-continuous. As a result, filtering this current is easier and the current measurement can operate with a lower bandwidth.

Furthermore, since a selected AC current can be measured quasi-continuously, as opposed to being measured only intermittently, the current can be controlled by a current controller which, for example, needs to compare the current measurement with an upper limit value and a lower limit value.

In embodiments, the current measurement circuit is configured to guide a selected one of the AC currents through the current measurement element, based on information which AC current is the selected one received during operation of the converter.

This information is determined during operation of the converter, and can be determined by a measurement controller that is integrated with a converter controller. Alternatively, this information can be determined by a measurement controller that receives switching commands for the converter bridge determined by a converter controller and applies, depending on which AC current is to be measured, selected switching commands to the current measurement circuit instead of the converter bridge.

Each of the bridge legs of the converter bridge includes an upper branch with an upper switching circuit (or simply "switch") with which an associated AC terminal connected to a midpoint of the bridge leg can be connected to the positive DC terminal, and a lower branch with a lower switching circuit (or switch) with which the associated AC terminal can be connected to the negative DC terminal.

A switching circuit, also simply called switch, can be bi-directional or unidirectional and can be implemented by a single solid state switch or an arrangement of solid state switches with associated circuitry as known in the art.

In a lower configuration, the current measurement circuit is connected to the at least three AC terminals and the negative DC terminal. Then each lower branch and each lower switch of the converter bridge (called converter switch) have an associated switch of the current measurement circuit (called measurement switch) which is connected to the same AC terminal.

In an upper configuration, the current measurement circuit is connected to the at least three AC terminals and the positive DC terminal. Then each upper branch and each upper switch of the converter bridge (called converter switch) have an associated switch of the current measurement circuit (called measurement switch), which is connected to the same AC terminal.

In embodiments, the converter is configured to measure one of the AC currents flowing through one of the AC terminals by closing the associated switch of the current measurement circuit instead of the associated lower (or upper) switch of the converter bridge.

In other words, in order to measure the current through the AC terminal that ordinarily, according to the control or modulation scheme with which the converter is operated, would pass through a lower (or upper) converter switch, this upper converter switch is not closed and instead the associated measurement switch is closed.

In embodiments, it can be the case that
the current measurement element includes a first terminal and a second terminal,
the first terminal of the current measurement element is connected to the negative DC terminal, or the first terminal of the current measurement element is connected to the positive DC terminal;
the current measurement circuit is able to connect each one of the at least three AC terminals to the first terminal of the current measurement element and to guide the AC current associated with the AC terminal that is connected to the first terminal of the current measurement element to flow through the current measurement element.

For both the upper and the lower configuration, the AC current to be measured thus passes through the current measurement element. The converter switch and the associated measurement switch are never closed at the same time, or, in other words, if one of the measurement switches is closed, then the associated converter switch is open.

As a result, it becomes possible to measure, with a single current measurement element, any chosen one of the AC currents flowing to the negative DC terminal (with a current measurement circuit in the lower configuration) or to the positive DC terminal (with the upper configuration implemented). Choosing which AC current is to be measured can be done during operation of the converter.

This can lead to different configurations of switch positions, depending on the modulation scheme. In particular, the following configurations can occur:

if, for an upper (lower) configuration, a single one of the upper (lower) converter switches are to be closed and the other upper (lower) converter switches are to be open, then the measurement switch associated with that single converter switch is closed instead, and the other measurement switches are open. In this manner, the current through the AC terminal associated with this single converter switch is measured. One of the measurement switches is closed and the others are open.

if, for an upper (lower) configuration, exactly two of the upper (lower) converter switches associated with two of the AC phases are to be closed and a single lower (upper) converter switch associated with the third one of the AC phases is to be closed, then the two measurement switches associated with the two upper (lower) converter switches are closed instead, and the third measurement switch is open. In this manner, the current through the AC terminal associated with the third one of the AC phases is measured, since this current equals the sum of the currents flowing through the two closed measurement switches. Two of the measurement switches are closed and the third is open.

More generally, if two or more of the AC currents are switched to flow through the current measurement element, then, because the sum of all AC currents must equal to zero, the current flowing through the measurement element corresponds to the sum of the AC currents not flowing through the measurement element.

The topology and measurement method described herein are particularly well suited for converters with small voltages, in particular lower than 100V and/or small power, in particular below 500 W or below 200 W, since such converters are switched with high switching frequencies.

Control or switching commands for the converter can be determined by essentially any modulation or control scheme, independently from the measurement of the AC currents. The AC current measurement can then be implemented to measure a particular AC current by guiding that AC current through the current measurement element by closing an associated measurement switch instead of an associated switch of the converter bridge.

In embodiments, the converter includes a controller arranged to operate the converter bridge by driving switches of the converter bridge and to measure an AC current flowing through a selected one of the at least three AC terminals by closing a switch of the current measurement circuit that is connected to the selected AC terminal in place of a switch of the converter bridge that is connected to the selected AC terminal.

The method for operating the converter includes the steps of:
  operating the converter bridge by switching the AC currents flowing through the at least three AC terminals;
  measuring a selected one of the AC currents by guiding it through the current measurement circuit instead of the converter bridge.

Thus, the entire selected AC current is made to flow through the current measurement element and a switch of the current measurement circuit instead of one of the switches of the converter bridge.

In embodiments, the method includes the steps of:
  operating the converter bridge by driving switches of the converter bridge;
  measuring an AC current flowing through a selected one of the at least three AC terminals by closing a switch of the current measurement circuit that is connected to the selected AC terminal in place of an associated switch of the converter bridge that is connected to the selected AC terminal.

In embodiments, the converter is driven by a six-step modulation scheme, in which each one of a set of switches of the converter bridge that have associated switches of the current measurement circuit is scheduled to remain closed during 60° intervals of a 360° interval after which the modulation scheme repeats, and the method includes the step of:
  closing, during these 60° intervals, instead of the switch of the converter bridge scheduled to remain closed, the associated switch of the current measurement circuit.

In embodiments, the converter is driven by a sinusoidal commutation control scheme.

Further embodiments are evident from the dependent patent claims. Features of the method claims may be combined with features of the device claims and vice versa.

BRIEF DESCRIPTION OF THE DRAWINGS

The subject matter of the invention will be explained in more detail in the following text with reference to exemplary embodiments which are illustrated in the attached drawings, which schematically show:

FIG. 7-10 sample signals for 6-step control of the converter;

FIG. 15-17 sample signals for sensorless position detection by means of the converter.

DETAILED DESCRIPTION OF THE INVENTION

In principle, identical parts are provided with the same reference symbols in the figures.

Figure 1:
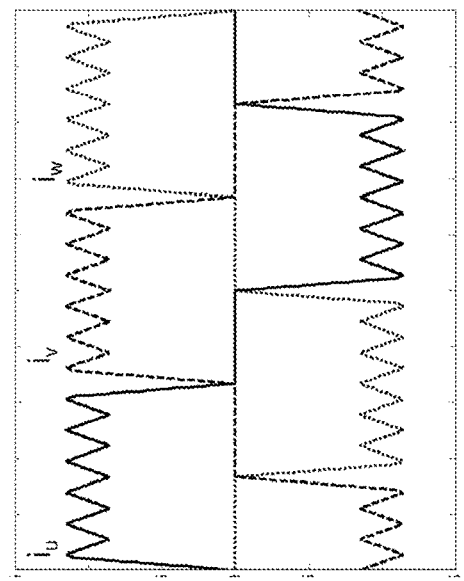
FIG. 1-4 a prior art measurement circuit and associated signals.
Figure 2:
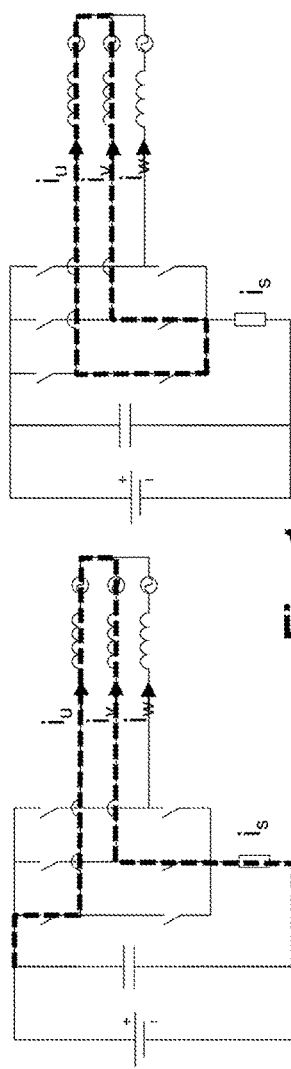
Figure 3:
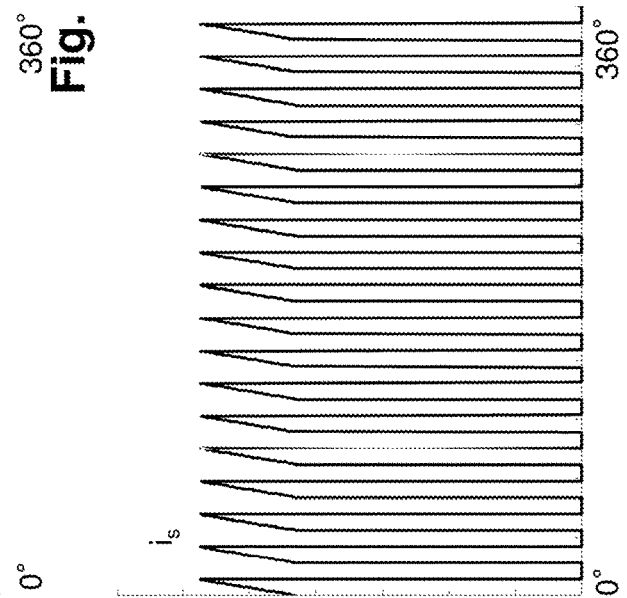
Figure 4:
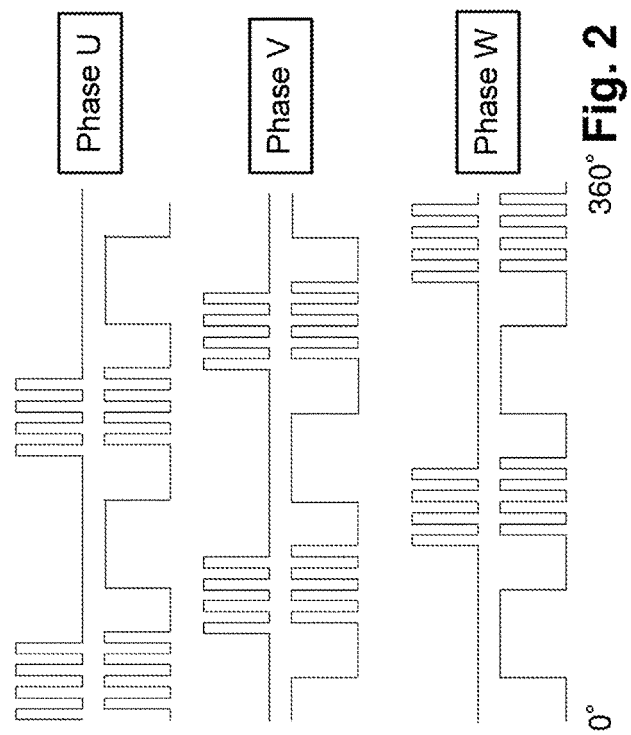

FIG. 1 shows a prior art converter with a measurement circuit that has a shunt in the DC link. A shunt current is consequently identical to a DC link current. A load is represented by a three-phase machine. The left side of FIG. 1 shows a state of the switches in which a current flows through two of the AC phases and through the DC link. The shunt current $i_S$ is identical to the AC currents $i_U$ and $i_V$, and measurement of the AC currents is therefore possible by means of the shunt. The right side of FIG. 1 shows a state of the switches in which the current through two of the AC phases is freewheeling and does not flow through the DC link. It therefore cannot be measured by the shunt, and the DC link and shunt current are zero. FIG. 2 shows switching patterns for the three bridge legs u, v, w, with for each phase drive signals for the upper and lower switches drawn above one another. FIGS. 3 and 4 show corresponding time histories of the AC phase currents $i_V$, $i_U$, $i_W$ and the shunt or DC link current is. Following the commonly known AC load 6-step inverter control scheme, for each bridge leg there are 60° periods (of the 360° period after which the scheme repeats, the period corresponding to the base AC frequency of the converter) during which that bridge leg remains in one state while first one and then the other of the other bridge legs switch, at a switching frequency higher than the base frequency, back and forth between applying the DC voltage to two AC terminals and freewheeling, thereby modulating the AC currents to remain quasi-constant for 120° periods. The resulting shunt current $i_S$ and its variation, with the switching frequency, between a maximum value and zero are evident from FIG. 4.

In FIG. 1 and in the other figures that schematically show switches of the converter 1, dashed lines symbolising current flow can be overlaid on the figure. In a state where the dashed line or current is drawn to pass through a switch, this means that the switch is closed, even if the drawing shows it in an open position.

Figure 5:
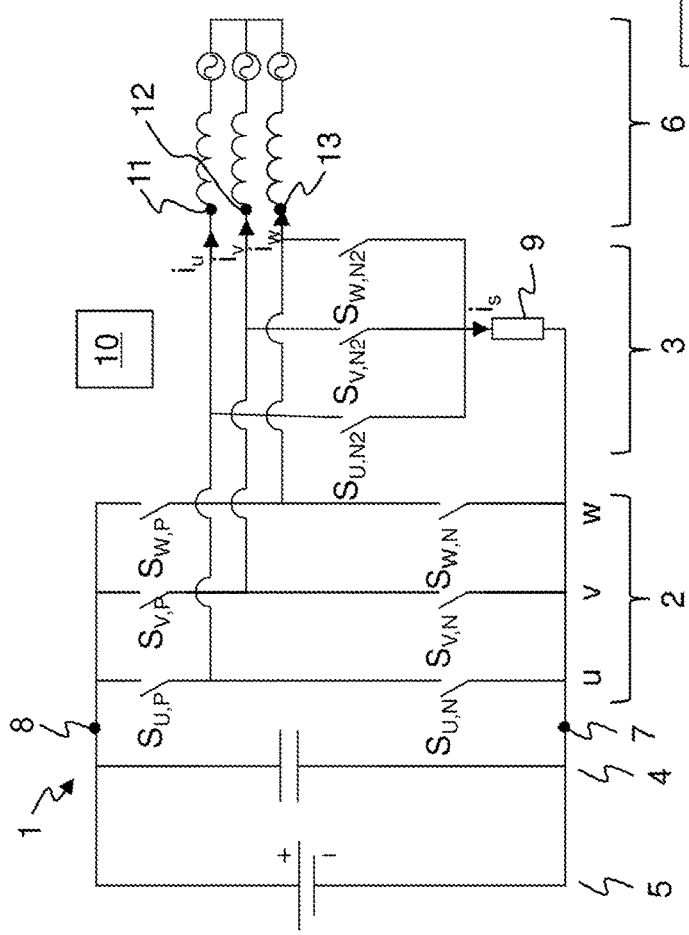
FIG. 5 a converter with a current measurement circuit in a lower configuration.

FIG. 5 shows a converter 1 with a converter bridge 2 and a current measurement circuit 3. The converter 1 includes on a DC side a negative DC terminal 7 and positive DC terminal 8 that can be connected to a DC smoothing capacitance 4 powered by a DC source 5. On an AC side, three AC terminals 11, 12, 13 can be connected to three phases of an AC load 6. The DC smoothing capacitance 4, DC source 5 and AC load 6 are not part of the converter 1 and it is understood that they can be replaced by other DC and AC circuits between which the converter 1 can be arranged to control power flow in one direction, the other direction or alternating between both directions. The converter bridge 2 includes bridge legs with upper switches $S_{U,P}$, $S_{V,P}$, $S_{W,P}$ and lower switches $S_{U,N}$, $S_{V,N}$, $S_{W,N}$.

The current measurement circuit 3 includes measurement switches $S_{U,N2}$, $S_{V,N2}$, $S_{W,N2}$ and is in a lower configuration, that is, with the current measurement circuit 3 connected to the negative DC terminal 7 through a current measurement element such as a shunt 9. Each measurement switch is associated with one of the lower switches. By opening one of the lower converter switches during a period when, according to a modulation scheme implemented by a controller 10 of the converter 1, it would be closed, and closing the associated measurement switch instead, the current that would pass through the lower converter switch is guided through the measurement switch and the shunt 9.

Figure 6:
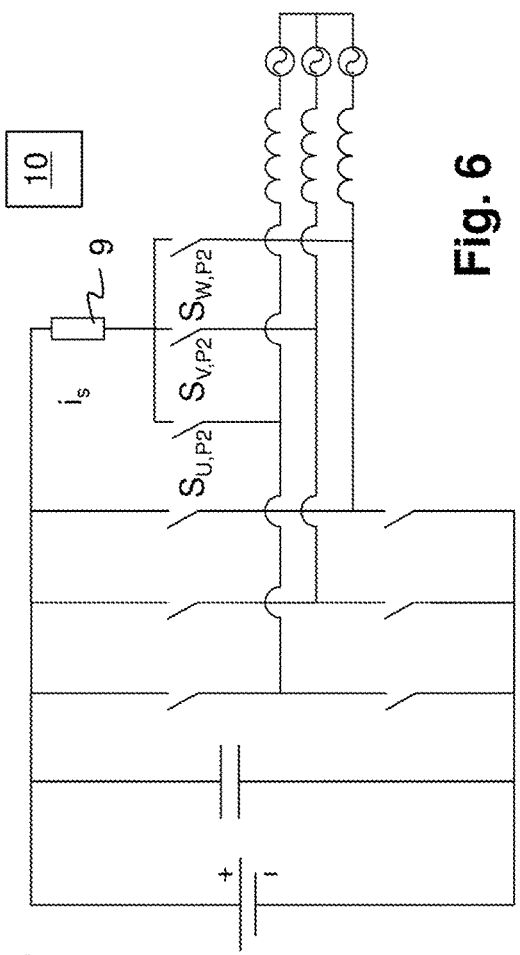
FIG. 6 a converter with a current measurement circuit in an upper configuration.
Figure 13:
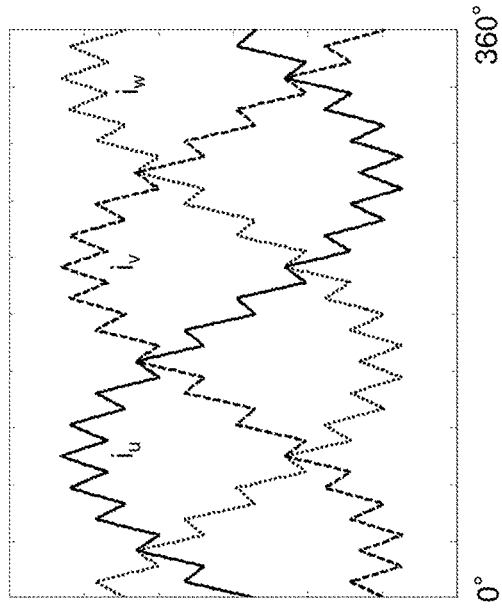
FIG. 11-14 sample signals for sinusoidal commutation control of the converter.

FIG. 6 shows the same elements as FIG. 5, but with the current measurement circuit 3 in an upper configuration and having measurement switches $S_{U,P2}$, $S_{V,P2}$, $S_{W,P2}$. That is, the current measurement circuit 3 is connected to the positive DC terminal 8 through the shunt 9. Each measurement switch is associated with one of the upper switches. By closing the associated measurement switch instead of one of the upper converter switches, the current that would pass through the upper converter switch is guided through the measurement switch and the shunt 9.

FIGS. 7-10 show sample signals for 6-step control of the converter. FIG. 7 shows the converter 1 of FIG. 5. The left side of FIG. 7 shows a state of the switches in which a current flows through two of the AC phases and through the DC link. The current is guided through the middle one of the measurement switches instead of the middle lower converter switch. The shunt current $i_S$ is identical to the AC currents $i_U$ and $i_V$. The right side of FIG. 7 shows a state of the switches in which the current through two of the AC phases is freewheeling and does not flow through the DC link. The current is again guided through the middle one of the measurement switches instead of the middle lower converter switch, and the shunt current $i_S$ is again identical to the AC currents $i_U$ and $i_V$. FIG. 8 shows switching patterns for the three bridge legs u, v, w, based on those of FIG. 2. However, in addition the switching signals for the measurement switches are shown. In each case, where in FIG. 2 one of the converter switches $S_{U,N}$, $S_{V,N}$, $S_{W,N}$ is kept open for a longer (60°) period, in FIG. 8 the corresponding measurement switch $S_{U,N2}$, $S_{V,N2}$, $S_{W,N2}$ is opened instead. FIGS. 9 and 10 show corresponding time histories of the AC phase currents $i_V$, $i_U$, $i_W$ and the shunt current $i_S$ which here is not always identical to the DC link current and instead also carries the freewheeling current. The AC currents are the same as in FIG. 3, but the shunt current $i_S$ does not drop to zero but is equal to one of the AC currents. It remains quasi-constant and has no discontinuities (meaning zero current intervals) and therefore much lower amplitudes of high frequency (switching frequency and other) components than in FIG. 4.

Figure 14:
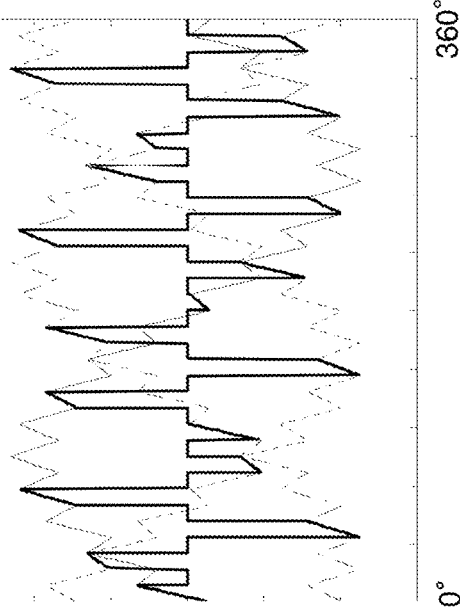
Figure 11:
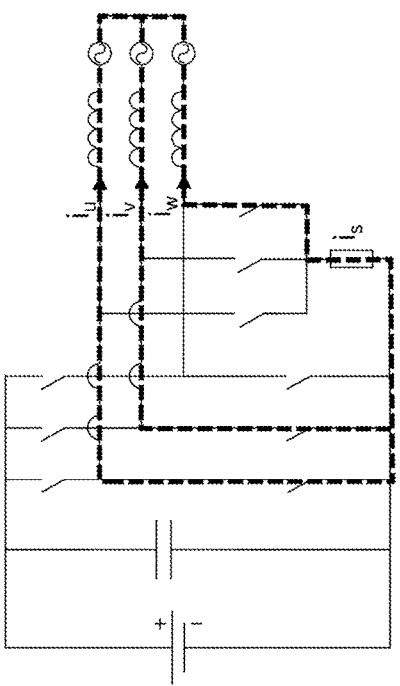
Figure 12:
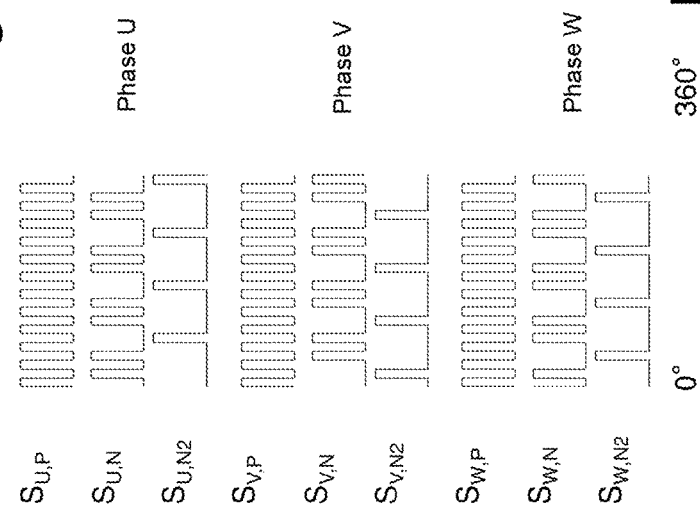

FIGS. 11-14 show sample signals for sinusoidal commutation control of the converter. As opposed to six-step control, where the AC currents are modulated to result in square blocks with quasi-constant currents, here the AC currents are modulated to follow, on average or when filtered, sine functions. Such modulation schemes for converter bridges 2 without the present current measurement circuit 3 are commonly known, resulting in current trajectories as in FIG. 13. The same current trajectories can also be reached with closing the corresponding measurement switches instead of the lower switch according to FIG. 12. With closing a single measurement switch instead of the corresponding lower switch, the corresponding phase current is routed to the shunt and can be measured as shown in FIG. 14. This allows to measure the three phase currents individually at least once in a switching interval. Compared to standard three-phase converters with single DC link current measurement the topology in FIG. 5 or FIG. 6 any modulation scheme can be applied independently of the current measurement scheme.

Further modulation schemes can be applied to make use of the single shunt current measurement such as space vector modulation, direct torque or power control, and fundamental switching. A corresponding sinusoidal modulation scheme or any other modulation scheme can be employed for the converter in FIG. 6 (upper configuration) instead of the converter in FIG. 5 (lower configuration).

FIGS. 15-17 show sample signals for sensor-less position detection by means of the converter. Voltage or current pulses can be applied to the motor and the current or voltage feedback can be measured by the shunt 9. Based on this feedback the position of the rotor can be determined. The converter topology according to FIG. 5 and FIG. 6 allows adjusting the bandwidth of the current measurement as desired.

The invention claimed is:

1. A converter, comprising
    a negative DC terminal and a positive DC terminal;
    at least three AC terminals, each AC terminal being arranged for an associated AC current to flow through the terminal;
    a converter bridge with at least three bridge legs, each bridge leg being associated with one of the at least three AC terminals and being able to connect the associated AC terminal to the negative DC terminal or the positive DC terminal;
    wherein the converter comprises
    a current measurement circuit comprising a current measurement element, the current measurement circuit being configured to guide either none or one or more of the AC currents flowing through one of the at least three AC terminals through the current measurement element;
    wherein the current measurement circuit is connected to the at least three AC terminals and the negative DC terminal, and each lower branch and each lower switch of the converter bridge have an associated switch of the current measurement circuit, which is connected to the same AC terminal; and
    wherein the current measurement circuit is configured to measure one of the AC currents flowing through one of the AC terminals by closing the associated switch of the current measurement circuit instead of the associated lower switch of the converter bridge.

2. The converter of claim 1, wherein the current measurement circuit is configured to guide a selected one of the AC currents through the current measurement element, based on information which AC current is the selected one received during operation of the converter.

3. The converter of claim 1,
    wherein the current measurement element comprises a first terminal and a second terminal,
    the first terminal of the current measurement element being connected to the negative DC terminal;
    the current measurement circuit being able to connect each one of the at least three AC terminals to the first terminal of the current measurement element and to guide the AC current associated with the AC terminal that is connected to the first terminal of the current measurement element to flow through the current measurement element.

4. The converter of claim 1, wherein the current measurement circuit is connected to the at least three AC terminals and the positive DC terminal, and each upper branch and each upper switch of the converter bridge have an associated switch of the current measurement circuit, which is connected to the same AC terminal.

5. The converter of claim 4, wherein the current measurement circuit is configured to measure one of the AC currents flowing through one of the AC terminals by closing the associated switch of the current measurement circuit instead of the associated upper switch of the converter bridge.

6. The converter of claim 1,
wherein the current measurement element comprises a first terminal and a second terminal,
the first terminal of the current measurement element being connected to the positive DC terminal;
the current measurement circuit being able to connect each one of the at least three AC terminals to the first terminal of the current measurement element and to guide the AC current associated with the AC terminal that is connected to the first terminal of the current measurement element to flow through the current measurement element.

7. The converter of claim 1, comprising a controller arranged to operate the converter bridge by driving switches of the converter bridge and to measure an AC current flowing through a selected one of the at least three AC terminals by closing a switch of the current measurement circuit that is connected to the selected AC terminal in place of a switch of the converter bridge that is connected to the selected AC terminal.

8. A method for operating the converter of claim 1, comprising the steps of:
operating the converter bridge by switching the AC currents flowing through the at least three AC terminals;
measuring a selected one of the AC currents by guiding it through the current measurement circuit instead of the converter bridge.

9. The method of claim 8, comprising the steps of:
operating the converter bridge by driving switches of the converter bridge;
measuring an AC current flowing through a selected one of the at least three AC terminals by closing a switch of the current measurement circuit that is connected to the selected AC terminal in place of an associated switch of the converter bridge that is connected to the selected AC terminal.

10. The method of claim 9, wherein the converter is driven by a six-step modulation scheme, in which each one of a set of switches of the converter bridge that have associated switches of the current measurement circuit is scheduled to remain closed during 60° intervals of a 360° interval after which the modulation scheme repeats, comprising the step of:
closing, during said 60° intervals, instead of the switch of the converter bridge scheduled to remain closed, the associated switch of the current measurement circuit.

11. The method of claim 9, wherein the converter is driven by a sinusoidal commutation control scheme.

12. The converter of claim 2,
wherein the current measurement element comprises a first terminal and a second terminal,
the first terminal of the current measurement element being connected to the negative DC terminal;
the current measurement circuit being able to connect each one of the at least three AC terminals to the first terminal of the current measurement element and to guide the AC current associated with the AC terminal that is connected to the first terminal of the current measurement element to flow through the current measurement element.

13. The converter of claim 2, wherein the current measurement circuit is connected to the at least three AC terminals and the positive DC terminal, and each upper branch and each upper switch of the converter bridge have an associated switch of the current measurement circuit, which is connected to the same AC terminal.

14. A converter, comprising
a negative DC terminal and a positive DC terminal;
at least three AC terminals, each AC terminal being arranged for an associated AC current to flow through the terminal;
a converter bridge with at least three bridge legs, each bridge leg being associated with one of the at least three AC terminals and being able to connect the associated AC terminal to the negative DC terminal or the positive DC terminal;
wherein the converter comprises
a current measurement circuit comprising a current measurement element, the current measurement circuit being configured to guide either none or one or more of the AC currents flowing through one of the at least three AC terminals through the current measurement element;
wherein the current measurement circuit is connected to the at least three AC terminals and the positive DC terminal, and each upper branch and each upper switch of the converter bridge have an associated switch of the current measurement circuit, which is connected to the same AC terminal;
wherein the current measurement circuit is configured to measure one of the AC currents flowing through one of the AC terminals by closing the associated switch of the current measurement circuit instead of the associated upper switch of the converter bridge.

15. A converter, comprising
a negative DC terminal and a positive DC terminal;
at least three AC terminals, each AC terminal being arranged for an associated AC current to flow through the terminal;
a converter bridge with at least three bridge legs, each bridge leg being associated with one of the at least three AC terminals and being able to connect the associated AC terminal to the negative DC terminal or the positive DC terminal;
wherein the converter comprises
a current measurement circuit comprising a current measurement element, the current measurement circuit being configured to guide either none or one or more of the AC currents flowing through one of the at least three AC terminals through the current measurement element;
and further comprising a controller arranged to operate the converter bridge by driving switches of the converter bridge and to measure an AC current flowing through a selected one of the at least three AC terminals by closing a switch of the current measurement circuit that is connected to the selected AC terminal in place of a switch of the converter bridge that is connected to the selected AC terminal.

16. A method for operating converter, said converter comprising:
a negative DC terminal and a positive DC terminal;
at least three AC terminals, each AC terminal being arranged for an associated AC current to flow through the terminal;
a converter bridge with at least three bridge legs, each bridge leg being associated with one of the at least three AC terminals and being able to connect the associated AC terminal to the negative DC terminal or the positive DC terminal;

wherein the converter comprises
a current measurement circuit comprising a current measurement element, the current measurement circuit being configured to guide either none or one or more of the AC currents flowing through one of the at least three AC terminals through the current measurement element;

the method comprising the steps of:
operating the converter bridge by switching the AC currents flowing through the at least three AC terminals;
measuring a selected one of the AC currents by guiding it through the current measurement circuit instead of the converter bridge.

17. A converter, comprising
a negative DC terminal and a positive DC terminal;
at least three AC terminals, each AC terminal being arranged for an associated AC current to flow through the terminal;
a converter bridge with at least three bridge legs, each bridge leg being associated with one of the at least three AC terminals and being able to connect the associated AC terminal to the negative DC terminal or the positive DC terminal;

wherein the converter comprises
a current measurement circuit comprising a current measurement element, the current measurement circuit being configured to guide either none or one or more of the AC currents flowing through one of the at least three AC terminals through the current measurement element;
wherein the current measurement circuit is configured to guide a selected one of the AC currents through the current measurement element, based on information which AC current is the selected one received during operation of the converter,
wherein the current measurement circuit is connected to the at least three AC terminals and the negative DC terminal, and each lower branch and each lower switch of the converter bridge have an associated switch of the current measurement circuit, which is connected to the same AC terminal.

18. A converter, comprising
a negative DC terminal and a positive DC terminal;
at least three AC terminals, each AC terminal being arranged for an associated AC current to flow through the terminal;
a converter bridge with at least three bridge legs, each bridge leg being associated with one of the at least three AC terminals and being able to connect the associated AC terminal to the negative DC terminal or the positive DC terminal;

wherein the converter comprises
a current measurement circuit comprising a current measurement element, the current measurement circuit being configured to guide either none or one or more of the AC currents flowing through one of the at least three AC terminals through the current measurement element;
wherein the current measurement circuit is configured to guide a selected one of the AC currents through the current measurement element, based on information which AC current is the selected one received during operation of the converter, wherein the current measurement element comprises a first terminal and a second terminal,
the first terminal of the current measurement element being connected to the negative DC terminal;
the current measurement circuit being able to connect each one of the at least three AC terminals to the first terminal of the current measurement element and to guide the AC current associated with the AC terminal that is connected to the first terminal of the current measurement element to flow through the current measurement element.

19. A converter, comprising
a negative DC terminal and a positive DC terminal;
at least three AC terminals, each AC terminal being arranged for an associated AC current to flow through the terminal;
a converter bridge with at least three bridge legs, each bridge leg being associated with one of the at least three AC terminals and being able to connect the associated AC terminal to the negative DC terminal or the positive DC terminal;

wherein the converter comprises
a current measurement circuit comprising a current measurement element, the current measurement circuit being configured to guide either none or one or more of the AC currents flowing through one of the at least three AC terminals through the current measurement element;
wherein the current measurement circuit is connected to the at least three AC terminals and the negative DC terminal, and each lower branch and each lower switch of the converter bridge have an associated switch of the current measurement circuit, which is connected to the same AC terminal;
wherein the current measurement element comprises a first terminal and a second terminal,
the first terminal of the current measurement element being connected to the negative DC terminal;
the current measurement circuit being able to connect each one of the at least three AC terminals to the first terminal of the current measurement element and to guide the AC current associated with the AC terminal that is connected to the first terminal of the current measurement element to flow through the current measurement element.

20. A converter, comprising
a negative DC terminal and a positive DC terminal;
at least three AC terminals, each AC terminal being arranged for an associated AC current to flow through the terminal;
a converter bridge with at least three bridge legs, each bridge leg being associated with one of the at least three AC terminals and being able to connect the associated AC terminal to the negative DC terminal or the positive DC terminal;

wherein the converter comprises
a current measurement circuit comprising a current measurement element, the current measurement circuit being configured to guide either none or one or more of the AC currents flowing through one of the at least three AC terminals through the current measurement element;
wherein the current measurement circuit is configured to guide a selected one of the AC currents through the current measurement element, based on information which AC current is the selected one received during operation of the converter wherein the current measurement circuit is connected to the at least three AC terminals and the positive DC terminal, and each upper branch and each upper switch of the converter bridge have an associated switch of the current measurement circuit, which is connected to the same AC terminal.

* * * * *